(12) United States Patent
Luo et al.

(10) Patent No.: US 9,939,595 B2
(45) Date of Patent: Apr. 10, 2018

(54) MULTI-CHANNEL LASER DEVICE WITH FIBER ARRAY

(71) Applicant: Global Technology Inc., Ningbo (CN)

(72) Inventors: Jian-Hong Luo, Ningbo (CN); Chao-Hung Tsai, New Taipei (TW); Peng Nie, Ningbo (CN); Hua Liu, Ningbo (CN)

(73) Assignee: Global Technology Inc., Ningbo (CN)

( * ) Notice: Subject to any disclaimer, the term of this patent is extended or adjusted under 35 U.S.C. 154(b) by 0 days.

(21) Appl. No.: 15/157,504

(22) Filed: May 18, 2016

(65) Prior Publication Data

US 2017/0059792 A1  Mar. 2, 2017

(30) Foreign Application Priority Data

Aug. 24, 2015  (CN) .................... 2015 2 0640868 U

(51) Int. Cl.
| | |
|---|---|
| *G02B 6/32* | (2006.01) |
| *G02B 6/42* | (2006.01) |
| *H01S 5/40* | (2006.01) |
| *H01S 5/42* | (2006.01) |
| *G02B 6/38* | (2006.01) |

(52) U.S. Cl.
CPC .............. *G02B 6/425* (2013.01); *G02B 6/32* (2013.01); *G02B 6/4208* (2013.01); *H01S 5/4031* (2013.01); *H01S 5/426* (2013.01); *G02B 6/3885* (2013.01); *G02B 6/4206* (2013.01); *G02B 6/4214* (2013.01); *G02B 6/4286* (2013.01); *G02B 6/4292* (2013.01)

(58) Field of Classification Search
None
See application file for complete search history.

(56) References Cited

U.S. PATENT DOCUMENTS

| | | |
|---|---|---|
| 4,470,143 A | 9/1984 | Kitamura et al. |
| 4,750,799 A | 6/1988 | Kawachi et al. |
| 5,032,879 A | 7/1991 | Buchmann et al. |

(Continued)

FOREIGN PATENT DOCUMENTS

JP    2004273782 A    9/2004

OTHER PUBLICATIONS

U.S. Office Action dated Jan. 9, 2017, received in U.S. Appl. No. 15/077,368, 18 pgs.

(Continued)

*Primary Examiner* — Jerry Rahll
(74) *Attorney, Agent, or Firm* — Grossman Tucker Perreault & Pfleger, PLLC; Norman S. Kinsella

(57) ABSTRACT

A multi-channel laser device with a fiber array includes a housing and a ferrule. In the housing, laser components are arranged side by side, and each of the laser components is connected to a fiber array module through an optical isolator. The fiber array module includes thermal expanded fibers, and fibers out of the fiber array module are collected by the ferrule. The laser components are disposed on the same module board, and laser light radiated from the front end of a laser chip in each of the laser components is projected onto the optical isolator through a convex lens and then enters into the thermal expanded fiber. Such a structure may reach a relatively-high coupling efficiency and implement the coupling of arrayed laser components.

4 Claims, 3 Drawing Sheets

(56) References Cited

U.S. PATENT DOCUMENTS

| | | | |
|---|---|---|---|
| 5,438,208 A | 8/1995 | Takemoto | |
| 5,668,823 A | 9/1997 | Harrison et al. | |
| 6,374,021 B1 | 4/2002 | Nakanishi et al. | |
| 6,567,590 B1 | 5/2003 | Okada et al. | |
| 7,013,056 B2 | 3/2006 | Lin et al. | |
| 7,106,980 B2 | 9/2006 | Nakanishi et al. | |
| 2002/0057876 A1 | 5/2002 | Yamabayashi et al. | |
| 2003/0059177 A1* | 3/2003 | Suzuki | G02B 6/4204 385/93 |
| 2003/0102496 A1 | 6/2003 | Kuhara et al. | |
| 2004/0184753 A1* | 9/2004 | Teramura | G02B 6/02395 385/128 |
| 2004/0222439 A1 | 11/2004 | Musk | |
| 2005/0068996 A1 | 3/2005 | Narayan | |
| 2005/0140968 A1* | 6/2005 | Lee | G02B 6/422 356/153 |
| 2006/0118893 A1* | 6/2006 | Behfar | G02B 6/4214 257/414 |
| 2006/0152926 A1* | 7/2006 | Hama | A61B 1/0017 362/231 |
| 2009/0269067 A1 | 10/2009 | Kihara et al. | |
| 2016/0202430 A1* | 7/2016 | de Jong | G02B 6/3853 385/33 |

OTHER PUBLICATIONS

U.S. Office Action dated Sep. 30, 2016, received in U.S. Appl. No. 15/077,426, 9 pgs.

\* cited by examiner

MULTI-CHANNEL LASER DEVICE WITH FIBER ARRAY

CROSS-REFERENCE TO RELATED APPLICATIONS

This non-provisional application claims priority under 35 U.S.C. § 119(a) on Patent Application No(s). 201520640868.8 filed in China on Aug. 24, 2015, the entire contents of which are hereby incorporated by reference.

BACKGROUND

Technical Field

The disclosure relates to the optical communication technology, more particularly to a multi-channel laser device with a fiber array.

Related Art

The existing technology of fiber laser devices usually grinds a general single-mode optical fiber until this fiber has a certain angle, e.g. about 8 degrees, at its cross-section, so that the fiber can couple to a laser component. Such a design reaches a coupling efficiency of 40~50%, and the fiber has a relatively narrow coupling area at its maximum point. Therefore, this fiber is more sensitive to its coupling position, and while this position slightly shifts by about 1 um, the light power may reduce by more than 3 dB. Such a design leads to a great difficulty in the production of optical devices and also requires high precise manufacturing equipment whereby the cost of the equipment increases. Moreover, to manufacture products having a relatively-high output power needs laser chips having an output power higher than that of the product since such a fiber has a coupling efficiency less than 50%. However, the price of a laser chip is directly proportional to its output light power so that the cost increases significantly. Additionally, the narrow coupling area of a general fiber is merely +/−3 um, so this kind of fibers cannot be used to implement the coupling of an array of laser components.

SUMMARY

What the present invention attempts to reach is to overcome the existing technical deficiencies and to provide a multi-channel laser device with a fiber array that has a relatively-high coupling efficiency and is capable of carrying out the coupling of an array of laser components.

To resolve the aforementioned technical problems, the present invention provides a multi-channel laser device with a fiber array, and the laser device includes a housing and a ferrule. In the housing, a plurality of laser components is arranged side by side and is disposed on the same module board. Each of the laser components is connected to a fiber array module through an optical isolator. The fiber array module includes a plurality of thermal expanded fibers, and the thermal expanded fibers out of the fiber array module are collected in the ferrule. Laser light radiated from a front end of a laser chip in each of the laser components is projected onto the optical isolator through a grin lens and then enters into the thermal expanded fiber.

The present invention using the foregoing structure has the following advantages: the thermal expanded fiber used in the structure has a wider input mode field diameter that is usually 2.5~3.5 times the input mode field diameter of a single-mode fiber, so this fiber may have relatively-high coupling efficiency and a relatively-wide area for light coupling; the use of an optical isolator may prevent the light, reflected by the components, from entering into the fibers, so as to enhance the linearity of the light-current-voltage (LIV) curves of fibers. Moreover, the present invention reaches the high coupling efficiency of the laser device and meanwhile requires a relatively-low precision of the equipment, so the laser components and fibers can respectively be arrayed to produce a laser device having a fiber array; and in general, 4, 8, 10 or 16 channels and so on are used, so the manufacturing cost may significantly be reduced.

As an improvement, each of the laser components includes a laser driving chip, a laser chip and a detector. The detector and the laser chip are disposed in front of the front end of the laser driving chip, and the back end of the laser chip faces the laser driving chip. A reflector is disposed between the back end of the laser chip and the detector and is configured to reflect light radiated from the back end of the laser chip to a receiving surface of the detector. In such a structure, a small amount of light radiated by the back end of the laser chip is reflected by the reflector toward the receiving surface of the detector, so the detector is capable of monitoring the operation of the laser chip. Moreover, the detector and the laser chip are disposed in front of the front end of the laser driving chip rather than beside the laser driving chip, so the components may occupy a smaller space on the module board, especially occupy the short wide of the module board, and the space occupied by the components may be minimized after the components are arrayed.

The convex lens is a cylindrical convex lens, having an end surface that is flat, and another end surface that is a salient spherical surface. Such a convex lens provides a better performance, and is easily disposed and arranged in the housing.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
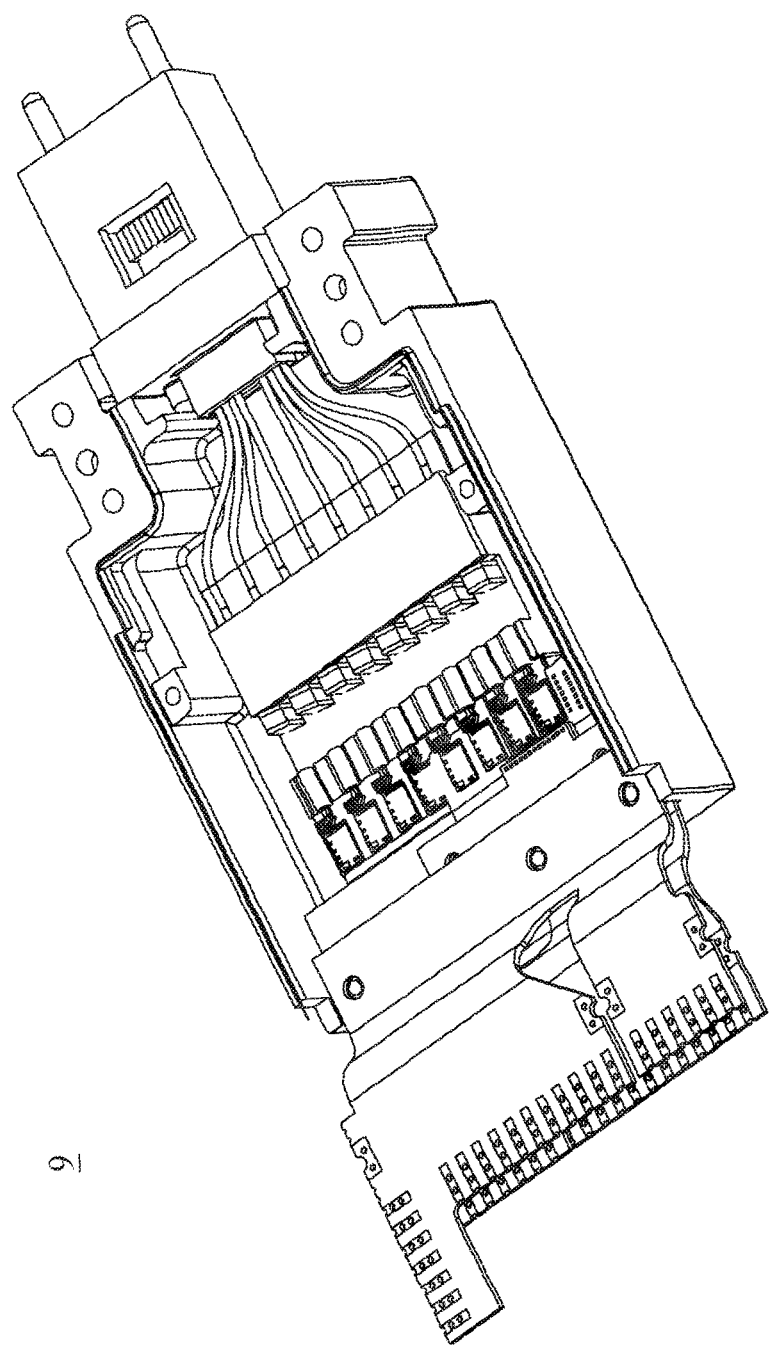
FIG. 1 is a graphical appearance of a multi-channel laser device with a fiber array in the present invention.
Figure 2:
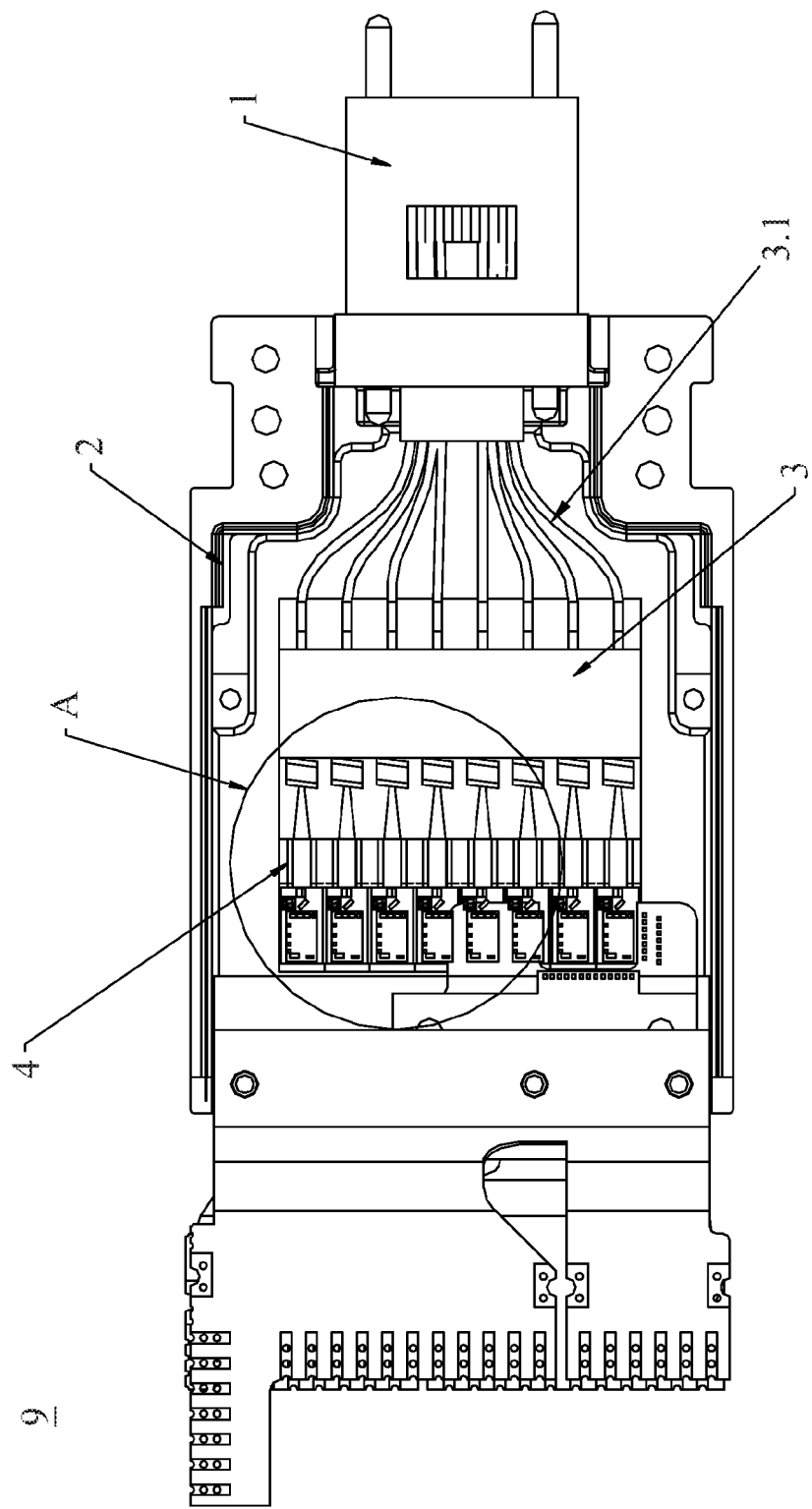
FIG. 2 is a schematic view of the internal structure of the housing of the multi-channel laser device in the present invention.
Figure 3:
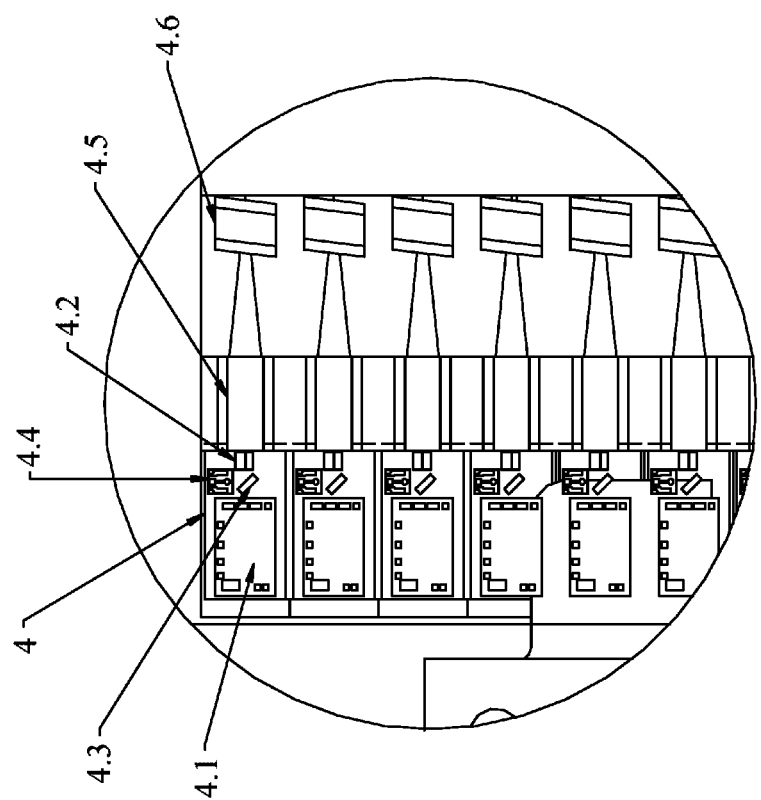
FIG. 3 is a schematic view of an enlargement of the part A in FIG. 2.

As shown in FIGS. 1, 2 and 3, the present invention provides a multi-channel arrayed laser device 9, which includes a housing 2 and a ferrule 1. In the housing 2, a plurality of laser components 4 are arranged side by side, each of the laser components 4 is connected to a fiber array module 3 through an optical isolator 4.6. The fiber array module 3 includes a plurality of thermal expanded fibers 3.1, and the fibers out of the fiber array module 3 are collected in the ferrule 1. The laser components 4 are disposed on the same module board. Laser light radiated from the front end of a laser chip 4.2 in each of the laser components 4 is projected onto the optical isolator 4.6 through a grin lens 4.5 and then enters into the thermal expanded fiber 3.1. The ferrule is used to provide a connection means for another component.

The thermal expanded fiber 3.1 has a larger coupling area than a general single-mode optical fiber, so the thermal expanded fibers 3.1 require lower precision during the coaxial disposition of the laser device. However, such a fiber has a relatively-large coupling area and thus, is easily affected by external light. The use of the optical isolator may avoid the effect of external light and enhance the coupling efficiency and reduce noises. Moreover, the thermal expanded fibers 3.1 require a relatively-low installation condition and thus, can be arrayed to assemble laser components in a device, and the manufacturing cost may reduce.

Each of the laser components 4 includes a laser driving chip 4.1, the laser chip 4.2 and a detector 4.4. The detector 4.4 and the laser chip 4.2 are disposed in front of the front end of the laser driving chip 4.1, and the back end of the laser chip 4.2 faces the laser driving chip 4.1. A reflector 4.3 is disposed between the back end of the laser chip 4.2 and the detector 4.4 and is used to reflect the light radiated from the back end of the laser chip 4.2 to the receiving surface of the detector 4.4.

The grin lens 4.5 is a cylindrical convex lens, which has an end surface that is flat or inclined by a certain angle, and another end surface that is a salient spherical surface. The cylindrical convex lens is capable of steadying pillars during its installation, the installation of the lens has the much less number of conditions than a general convex lens, and the cylindrical convex lens is not easy to be swayed after being installed.

What is claimed is:

1. A multi-channel laser device with a fiber array, comprising:
    a housing having a cavity, wherein the cavity includes:
        a plurality of laser components, arranged side by side and disposed on a module board;
        a fiber array module comprising a plurality of thermal expanded fibers;
        an optical isolator optically coupled to each of the thermal expanded fibers; and
        a grin lens optically coupled to each optical isolator, wherein laser light radiated from a front end of a laser chip in each of the laser components is projected onto the optical isolator through the grin lens such that the laser light passes through the optical isolator and enters into the thermal expanded fiber; and
    a ferrule for collecting the thermal expanded fibers out of the fiber array module.

2. The multi-channel laser device according to claim 1, wherein each of the laser components comprises a laser driving chip, the laser chip and a detector, the detector and the laser chip are disposed in front of the front end of the laser driving chip, a back end of the laser chip faces the laser driving chip, and a reflector is disposed between the back end of the laser chip and the detector for reflecting light radiated from the back end of the laser chip to a receiving surface of the detector.

3. The multi-channel laser device according to claim 1, wherein the grin lens is a cylindrical convex lens which has an end surface that is flat or inclined, and another end surface that is a salient spherical surface.

4. A multi-channel laser device with a fiber array comprising:
    a housing defining a cavity, wherein the cavity includes:
        a plurality of laser chips;
        a grin lens optically coupled to a respective laser chip;
        an optical isolator such that laser light radiated from the laser chip is projected from the grin lens to the optical isolator; and
        a thermal expanded fiber optically coupled to a respective optical isolator such that the laser light passes through the optical isolator to the thermal expanded fiber.

* * * * *